(12) United States Patent
Smith

(10) Patent No.: US 11,863,193 B2
(45) Date of Patent: Jan. 2, 2024

(54) METASTABILITY CORRECTION FOR RING OSCILLATOR WITH EMBEDDED TIME TO DIGITAL CONVERTER

(71) Applicant: TEXAS INSTRUMENTS INCORPORATED, Dallas, TX (US)

(72) Inventor: Ryan Alexander Smith, Lucas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/389,240

(22) Filed: Jul. 29, 2021

(65) Prior Publication Data

US 2023/0030425 A1    Feb. 2, 2023

(51) Int. Cl.
| | | |
|---|---|---|
| *H03L 7/099* | (2006.01) | |
| *G04F 10/00* | (2006.01) | |
| *H03K 3/037* | (2006.01) | |
| *H03K 19/0175* | (2006.01) | |
| *H03M 7/16* | (2006.01) | |

(52) U.S. Cl.
CPC .......... *H03L 7/0995* (2013.01); *G04F 10/005* (2013.01); *H03K 3/037* (2013.01); *H03K 19/017509* (2013.01); *H03M 7/16* (2013.01); *H03L 2207/50* (2013.01)

(58) Field of Classification Search
CPC ... G04F 10/005; H03L 7/0995; H03L 7/0996; H03L 2207/50
See application file for complete search history.

(56) References Cited

U.S. PATENT DOCUMENTS

| | | | | |
|---|---|---|---|---|
| 5,812,626 A | * | 9/1998 | Kusumoto | ................ G06F 1/10 714/E11.155 |
| 5,999,586 A | * | 12/1999 | Terada | ..................... G01D 3/00 327/295 |
| 7,653,170 B2 | * | 1/2010 | Mattes | .................... G04F 10/04 377/20 |

(Continued)

FOREIGN PATENT DOCUMENTS

| | | | | |
|---|---|---|---|---|
| JP | 2000315941 A | * | 11/2000 | ........... H03K 3/0315 |
| JP | 2011045006 A | * | 3/2011 | ........... H03K 3/0315 |
| WO | 2018063231 A1 | | 4/2018 | |

OTHER PUBLICATIONS

Chen, M., et al. "A Calibration-Free 800MHz Fractional-N Digital PLL with Embedded TDC," 2010 IEEE International Solid-State Circuits Conference, ISSCC 2010/Session 26/High-Performance & Digital PLLS, 4 pages.

(Continued)

*Primary Examiner* — Levi Gannon
(74) *Attorney, Agent, or Firm* — Krista Y. Chan; Frank D. Cimino

(57) ABSTRACT

A system includes a ring oscillator including an odd number of inverters arranged in a ring. The system also includes a time to digital converter including an odd number of flops, where each of the flops is coupled to an output of a different inverter. The system includes a level shifter coupled to the inverters and to the flops. The system also includes a Gray counter coupled to at least one of the flops. The system includes a decoder coupled to the time to digital converter. The system also includes a phase frequency detector coupled to the decoder.

20 Claims, 6 Drawing Sheets

(56) References Cited

U.S. PATENT DOCUMENTS

| | | | | |
|---|---|---|---|---|
| 2002/0008589 A1* | 1/2002 | Lanoman | ................ | H03L 7/183 |
| | | | | 331/34 |
| 2006/0103566 A1 | 5/2006 | Vemulapalli et al. | | |
| 2010/0260242 A1* | 10/2010 | Abe | ......................... | H03K 5/13 |
| | | | | 331/34 |
| 2012/0307923 A1* | 12/2012 | Bogdan | ............... | H04L 27/2647 |
| | | | | 375/260 |

OTHER PUBLICATIONS

Hiraku, Y., et al., "A 0.5V 10 MHz-to-100MHz 0.47pW/MHz Power Scable AD-PLL in 40nm CMOS," IEEE Asian Solid-State Circuits Conference, Industry 2-3, Kobe, Japan, Nov. 12-14, 2012, 4 pages.

International Search Report dated Nov. 17, 2022, PCT Application No. PCT/US2022/038449, 5 pages.

Written Opinion dated Nov. 17, 2022, PCT Application No. PCT/US2022/038449, 8 pages.

* cited by examiner

500

| | A | B | C | D |
|---|---|---|---|---|
| | VALID B <6:0> STATES | TRANSITION STATE? | POSSIBLE TDC_OUT <6:0> | DECODER FRACTIONAL VALUE |
| 1 | 0000111 | N | 0000111 | 5/14 |
| 2 | 0001111 | Y | 0000111<br>0001111<br>0001110<br>0000110 | 6/14 |
| 3 | 0001110 | N | 0001110 | 7/14 |
| 4 | 0011110 | Y | 0001110<br>0011110<br>0011100<br>0001100 | 8/14 |
| 5 | 0011100 | N | 0011100 | 9/14 |
| 6 | 0111100 | Y | 0011100<br>0111100<br>0011000<br>0111000 | 10/14 |
| 7 | 0111000 | N | 0111000 | 11/14 |
| 8 | 1111000 | Y | 0111000<br>1111000<br>1110000<br>0110000 | 12/14 |
| 9 | 1110000 | N | 1110000 | 13/14 |
| 10 | 1110001 | Y | 1110000<br>1110001<br>1100001<br>1100000 | 0/14 |
| 11 | 1100001 | N | 1100001 | 1/14 |
| 12 | 1100011 | Y | 1100001<br>1100011<br>1000011<br>1000001 | 2/14 |
| 13 | 1000011 | N | 1000011 | 3/14 |
| 14 | 1000111 | Y | 1000011<br>1000111<br>0000111<br>0000011 | 4/14 |

FIG. 5

METASTABILITY CORRECTION FOR RING OSCILLATOR WITH EMBEDDED TIME TO DIGITAL CONVERTER

BACKGROUND

A phase-locked loop (PLL) is a system that compares the frequency of a local oscillator to that of a received input signal, and uses a feedback loop to lock the local oscillator's frequency to that of the received input signal. The output frequency of the local oscillator may also be a multiple of the input frequency. In a PLL, the phase of the output signal is related to the phase of the input signal. The local oscillator generates a periodic signal, and a phase detector compares the phase of the periodic signal with the phase of the input signal. The phase detector then adjusts the oscillator to keep the phases matched. Phase may be measured using a time to digital converter (TDC). A TDC uses a string of delay elements (such as buffers or inverters) and a series of flops that sample the delay elements at certain points in time. A signal propagates through the delay elements, and the samples collected by the flops produce a digital code that indicates the phase information of the output signal.

SUMMARY

In accordance with at least one example of the description, a system includes a phase locked loop including a ring oscillator. The ring oscillator includes an odd number of inverters arranged in a ring and a set of flops, where each flop of the set of flops is coupled to an output of a different inverter of the inverters. The system also includes a decoder configured to receive a code from the set of flops, where the code represents a phase of the ring oscillator. Responsive to the code being invalid, the decoder is configured to decode the invalid code to a valid code. The decoder is also configured to provide the valid code to a phase frequency detector.

In accordance with at least one example of the description, a method includes receiving a reference signal at a set of flops. Responsive to receiving the reference signal, the method includes capturing an output of a different stage of a multi-stage ring oscillator with each of the set of flops. The method also includes providing a code to a decoder, where the code is based at least in part on the outputs of the stages. Responsive to the code being invalid, the method includes decoding the invalid code to a valid code. The method also includes providing the valid code to a phase frequency detector.

In accordance with at least one example of the description, a system includes a ring oscillator including an odd number of inverters arranged in a ring. The system also includes a time to digital converter including an odd number of flops, where each of the flops is coupled to an output of a different inverter. The system includes a level shifter coupled to the inverters and to the flops. The system also includes a Gray counter coupled to at least one of the flops. The system includes a decoder coupled to the time to digital converter. The system also includes a phase frequency detector coupled to the decoder.

BRIEF DESCRIPTION OF THE DRAWINGS

FIG. 5 is a table of valid and invalid codes for a 7-stage ring oscillator with an embedded TDC in accordance with various examples.

DETAILED DESCRIPTION

Figure 1:
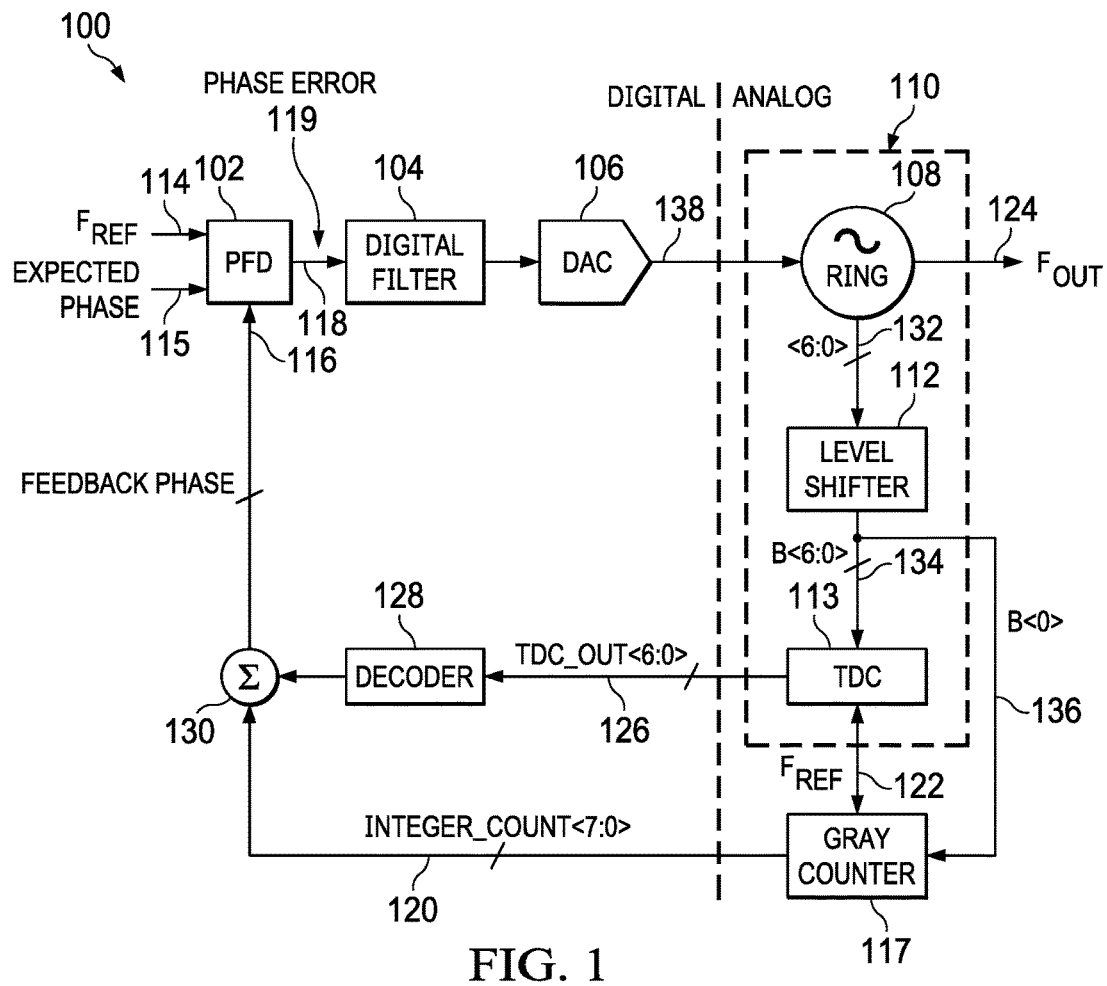
FIG. 1 is a system including a digital PLL with a ring oscillator and an embedded TDC in accordance with various examples.

A digital PLL receives a reference signal $F_{REF}$ having a relatively stable frequency at an input and produces an output signal with a frequency that is a multiple of the reference signal at an output, referred to as $F_{OUT}$. The digital PLL also locks the phase of the output signal with the input signal. To lock the phases of the two signals, the phase error between the two signals is measured. To measure the phase error, a TDC may be useful. A classical TDC includes a set of inverters arranged in a chain. When the edge of a digital signal occurs (e.g., a rising edge or a falling edge) at the input of the first inverter, that edge propagates through the chain of inverters. Each inverter has a small finite delay between when it receives the edge at its input and when the output of the inverter changes. The outputs of the inverters in the chain may be sampled at a specific time using flops. The samples collected by the flops indicate how far the edge has passed through the chain of inverters. For example, if a chain of seven inverters is sampled and the result of the sampling is 1110000, the edge has passed through the first three inverters but not through the last four (indicated by the three ones followed by four zeros). These samples create a digital code that indicates the phase error between $F_{REF}$ and $F_{OUT}$, measured by the number of inverter delays. The phase error is useful for phase locking the input signal and the output signal.

A digital PLL may include a ring oscillator with an embedded TDC. An embedded TDC uses flops to capture phase information directly from the inverters that compose the ring oscillator. The embedded TDC is coupled to the output of each ring oscillator stage and samples the data at the output with a flop at a specific point in time, responsive to the receipt of a reference signal. The samples collected by the flops create a digital code as described above. The value of the digital code indicates the fractional phase information of the ring oscillator (for example, $2/7$, $3/7$, $6/7$, etc. for a TDC with seven inverters). The fractional phase information is then used to determine a phase error between the input and output signals. In embedded TDC systems, the reference signal that indicates when sampling of the inverters should occur may arrive close to the time of a data transition for one or more flops. If the data is sampled close to the time of a data transition of the flops, a metastability problem may occur, and an old value may be sampled instead of a new value that should have been sampled, or vice versa. Therefore, the flops may collect an invalid digital code. Invalid codes can result in poor jitter performance, slower lock time, and/or an inability for the PLL to remain locked. In some alternative solutions, additional circuitry may be used to mitigate the effects of invalid codes. However, these solutions increase complexity and power consumption. In other alternative solutions, an invalid code may be discarded.

Discarding an invalid code prevents the PLL from adjusting the ring oscillator for that cycle, which can affect jitter.

This disclosure describes various examples of a digital PLL with an embedded TDC that is configured to decode an invalid code to a closest valid code. In one example, an N-stage ring oscillator with an embedded TDC has N cyclic TDC states. Because the rising and falling edges of the output signals of the inverters in the embedded TDC do not rise and fall instantaneously, short transitionary states may occur. These transitionary states are states where some, but not all, of the edge transitions have occurred. The transitionary states may be decoded, and are considered a valid code. The transitionary states combined with the N cyclic valid TDC states results in 2N valid codes, which are described below. Codes produced other than the 2N valid codes are decoded to one of the 2N valid codes instead of being discarded. In examples herein, a seven-stage ring oscillator is described. However, ring oscillators of other sizes may be used in other examples.

FIG. 1 is a system 100 including a digital PLL with a ring oscillator and an embedded TDC in accordance with various examples. In one example of system 100, components on the left side of FIG. 1 may be digital components, while components on the right side of FIG. 1 may be analog components. System 100 includes a phase frequency detector (PFD) 102, a digital filter 104, and a digital to analog converter (DAC) 106. An oscillator 108 is a component of an embedded TDC system 110. Embedded TDC system 110 includes oscillator 108, level shifter 112, and TDC 113. PFD 102 includes a first input 114, a second input 115, a third input 116, and an output 118. Output 118 provides phase error 119. System 100 includes Gray counter 117, feedback loop 120, link 122, output 124, output 126, decoder 128, and summation 130. Oscillator 108 provides an output 132, which may include seven bits, shown as <6:0> in FIG. 1. Level shifter 112 receives output 132 and provides outputs 134 and 136. Level shifter 112 produces an output of seven bits labeled B<6:0> at output 134 to TDC 113, and produces the output bit B<0> at output 136. TDC 113 uses bits B<6:0> to produce a TDC_OUT <6:0> value. Gray counter 117 uses bit B<0> to determine integer phase information, as described below.

Embedded TDC system 110 receives an input signal at input 138 of oscillator 108, and produces an output frequency signal $F_{OUT}$ at output 124. Embedded TDC system 110 also produces a TDC_OUT value at output 126, which is provided to decoder 128 in some examples. The details of embedded TDC system 110 are described below with respect to FIGS. 3A and 3B. In other examples, various components of embedded TDC system 110 may be within oscillator 108 or may be located outside of oscillator 108.

In system 100, a counter (such as Gray counter 117) increments to represent integer phase information on feedback loop 120 (e.g., INTEGER_COUNT <7:0>), while TDC 113 provides fractional phase information. Integer phase information indicates how many cycles the $F_{OUT}$ signal completes for every cycle of the $F_{REF}$ signal. For example, if system 100 is programmed to produce an $F_{OUT}$ signal that is four times the frequency of input signal $F_{REF}$, Gray counter 117 counts the cycles of $F_{OUT}$. If system 100 is operating as programmed, four $F_{OUT}$ cycles will complete for every $F_{REF}$ cycle. Gray counter 117 provides that information along feedback loop 120 to summation 130. Fractional phase information is the captured phase information of $F_{REF}$ for a single cycle of the $F_{OUT}$ signal. These two pieces of information are captured separately and merged by summation 130 to provide integer plus fractional phase information to PFD 102 at third input 116, shown as feedback phase in FIG. 1. For example, if $F_{OUT}$ at output 124 is programmed to be 12.5 times a reference signal $F_{REF}$ at first input 114, then for every $F_{REF}$ cycle, the outputs from Gray counter 117 and TDC 113 summed together (by summation 130) would increment by 12.5 cycles. In this manner, system 100 may provide an output signal $F_{OUT}$ at a higher frequency than $F_{REF}$.

System 100 locks the phase of $F_{OUT}$ with $F_{REF}$. To lock the phases of $F_{OUT}$ and $F_{REF}$, the phase error between $F_{OUT}$ and $F_{REF}$ is first measured, and then used to adjust $F_{OUT}$. In alternative systems, the phase error is measured with a TDC inside PFD 102. This TDC, inside PFD 102, has a set of buffers or inverters arranged in a chain. After an edge of a reference signal occurs (e.g., a rising edge or falling edge), that edge propagates through the chain of inverters, as described above. Each inverter has a small finite delay. Then, at the time the feedback clock signal arrives at the PFD 102, the reference signal propagating through the inverters is sampled using flops within the TDC, with one flop coupled to the output of each inverter. In this alternative system, the samples from the flops may be three ones (111), followed by a number of zeros, because the reference signal had not passed through all of the inverters in the chain, only three of them. The three ones indicate, in the amount of inverter delays, how much phase error exists between the reference signal and the feedback clock signal.

The TDC inside PFD 102 as described above in the alternative systems may be area intensive and consume a large amount of power. The delay of the inverters in the alternative system also needs to be calibrated to know how much time is consumed by each inverter delay. In examples herein, oscillator 108 is a ring oscillator, which includes a chain of inverters arranged in a ring. A ring oscillator includes an odd number N of inverters in a ring, with an output that oscillates between two values. The output of the last inverter is provided back into the first inverter. Adjusting a voltage or current provided to the inverter may change the delay through the inverter and therefore its frequency. In this example, calibration is not needed as it is in the alternative system described above.

The chain of inverters in oscillator 108 may be used as an embedded TDC in accordance with various examples herein. The TDC is embedded within oscillator 108, and therefore is referred to as embedded TDC system 110. Here, the TDC 113 is shown as a separate component in FIG. 1 for clarity, although the TDC 113 is actually embedded within oscillator 108. The data at the outputs of the inverters within oscillator 108 may be sampled and used to determine the phase of the signal produced by oscillator 108. Therefore, some of the hardware of the oscillator 108 (e.g., the chain of inverters) may be reused for the time to digital conversion (e.g., TDC 113) to measure the phase error of the oscillator signal. Reusing this hardware may reduce area requirements and power consumption in some examples.

In examples herein, TDC 113 produces a TDC_OUT signal at output 126 that includes a series of bits. This series of bits indicates the phase of the signal produced by oscillator 108, as described above. The TDC_OUT signal at output 126 is provided to decoder 128. If decoder 128 determines that the TDC_OUT signal is a valid code, decoder 128 provides the valid code to PFD 102 at third input 116, via summation 130. Then, PFD 102 determines the phase from the valid code and compares it to an expected phase of $F_{REF}$ on second input 115. PFD 102 produces a phase error 119 and provides the phase error 119 to digital filter 104. The phase error is received by DAC 106 and then provided to oscillator 108, where oscillator 108 is adjusted responsive to the phase error. The adjustment is performed to phase lock the output signal $F_{OUT}$ with the input signal $F_{REF}$.

Figure 6:
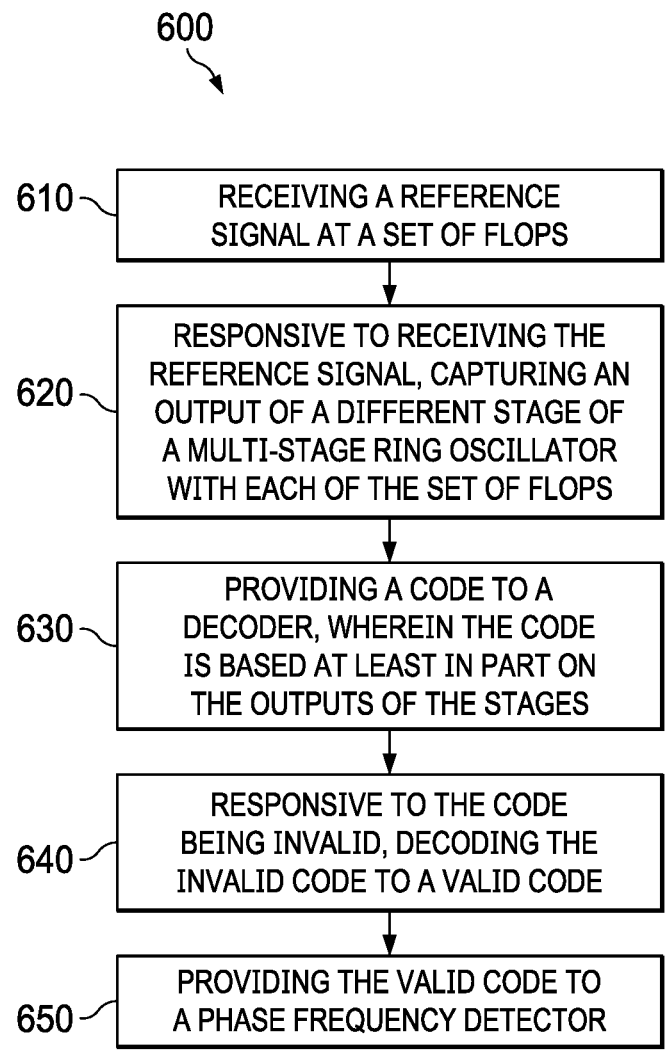
FIG. 6 is a flow diagram of a method for metastability correction in accordance with various examples.

If decoder 128 determines that the TDC_OUT signal is an invalid code, the invalid code is decoded to a valid code as described in examples herein. The valid code is then provided to PFD 102 by decoder 128 via summation 130, and PFD 102 computes the phase error 119 as described above based on the valid code. In some examples, decoder 128 may be a component of PFD 102, or may be within another component of system 100. Decoder 128 is configured to decode the invalid codes using any suitable decoding scheme or algorithm. Decoder 128 may be implemented in hardware, software, or a combination of the two. In one example, decoder 128 decodes the codes using a lookup table, as described below with respect to FIG. 5. In one example, a non-transitory computer-readable medium is provided. The non-transitory computer-readable medium includes all electronic mediums or media of storage, except signals. The non-transitory computer-readable medium stores executable code. When executed by a processor or controller of an electronic device, the executable code performs the steps described herein to determine validity of a code, and to decode an invalid code. In one example, some or all of the steps described below with respect to FIG. 6 are performed by a processor or controller executing executable code. In other examples, additional processes described herein are performed by a processor or controller executing executable code. In some examples, the processor or controller may be decoder 128. In other examples, the processor or controller may be a component separate from decoder 128.

Figure 2:
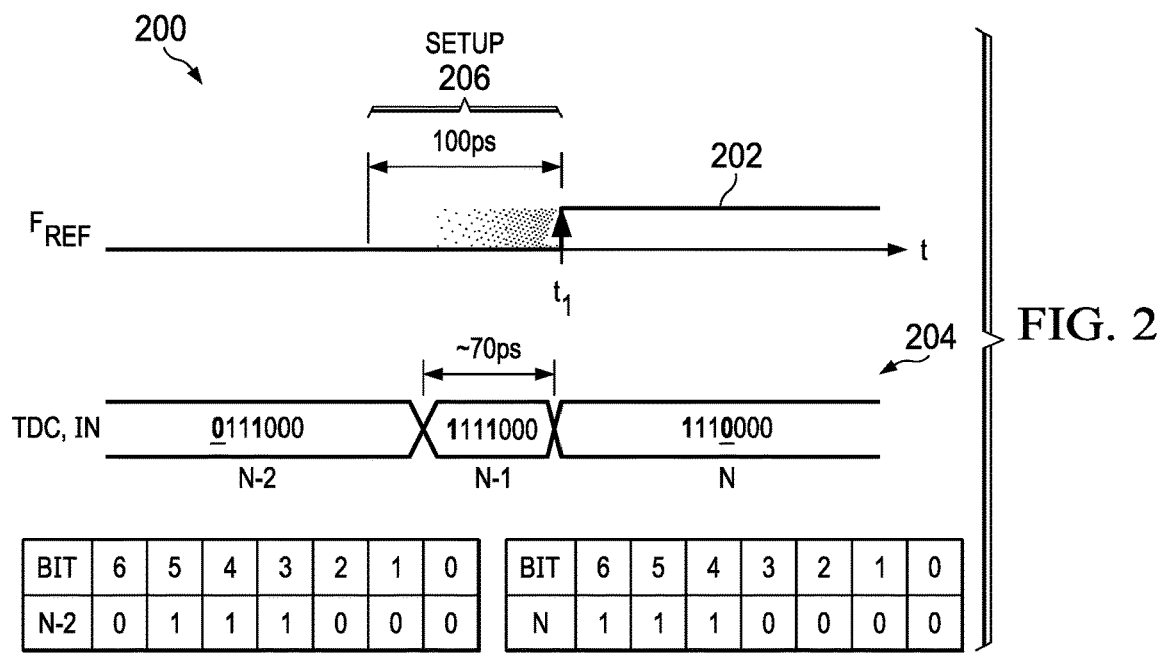
FIG. 2 is a timing diagram for a TDC in accordance with various examples.

FIG. 2 is a timing diagram 200 for a TDC in accordance with various examples herein. FIG. 2 shows a timing diagram for an example system with a 7-stage ring oscillator operating at 240 MVHz. Timing diagram 200 includes waveform 202, TDC, IN data 204, and setup 206. Waveform 202 is a reference frequency $F_{REF}$ that is provided to TDC 113 via link 122. $F_{REF}$ is a reference signal that goes high (e.g., a rising edge) to indicate that the flops in TDC 113 should capture the value at their respective inputs (e.g., 0 or 1). For example, a D flip-flop captures the value at the D-input upon receipt of the specified edge (e.g., rising or falling) of the clock. After the rising/falling clock edge, the captured value is available at the Q output of the D flip-flop. However, flops may have metastability problems. Flops have a setup and hold time during operation. In an example, the setup time is a minimum amount of time before the clock's active edge that the data being sampled must be stable for the data to be latched correctly by the flop. A violation of the setup time may cause incorrect data to be captured by the flop, which is known as a setup violation. Hold time is the minimum amount of time after the clock's active edge during which the data must be stable. A hold time violation may cause incorrect data to be latched, which is known as a hold violation.

An example setup/hold time is shown in FIG. 2 as setup 206. In this example, setup 206 is approximately 100 picoseconds. Three states of TDC 113 are shown in time order, and are labeled N−2, N−1, and N. The 7-stage ring oscillator includes 7 inverters, and therefore TDC 113 captures 7 bits, which are labeled bit 6 to bit 0, left to right. In this example, N−2 is a cyclic valid state with three ones. Valid states produced when no setup or hold violations occur may be referred to as cyclic valid states. In the illustrated examples, each cyclic valid state has three ones (e.g., for N−2, bits 5, 4, and 3 are ones, while bits 6, 2, 1, and 0 are zeros), although the number of ones and zeros is merely exemplary. Also, N is a cyclic valid state with three ones. In state N, bits 6, 5, and 4 are ones, while bits 3, 2, 1, and 0 are zeros. When the state N−2 changes to state N, bit 6 changes from 0 to 1, and bit 3 changes from 1 to 0. The other bits remain the same. That is, 0111000 changes to 1110000. The flops in TDC 113 are independent, so the bits captured by the flops change independently of one another as well.

In this example, there is a short transition state between states N−2 and N. The transition state is labeled state N−1. In the state N−1, bit 6 has changed from 0 to 1, but bit 3 has not yet changed from 1 to 0. Therefore, the code for state N−1 has four ones instead of three ones. The codes with four ones are referred to herein as transition states. The transition states may occur between cyclic valid states that have three ones. In the example of a 7-stage ring oscillator, there are seven cyclic valid states with three ones (1110000, 0111000, etc.) and seven transition states with four ones (1111000, 0111100, etc.). As described below, the transition states are short in duration and may violate setup and hold times of the flops. In the example in FIG. 2, the transition state N−1 is approximately 70 picoseconds long. The setup 206 is approximately 100 picoseconds, so the N−1 state may violate the setup and hold times.

The rising edge of $F_{REF}$ arrives at time $t_1$ in the example in FIG. 2. Time $t_1$ is close to the window where bits are updating from N−2 state to N state, so metastability may occur. At time $t_1$, either or both of bits 6 and 3 may still be in the process of updating. In one example, at time $t_1$, bit 6 may have not yet updated from 0 to 1, and bit 3 may have updated from 1 to 0. Therefore, the code that is captured is 0110000 in this example. This code is an invalid code that has only two ones. In examples herein, invalid codes with only two ones are decoded to the closest transition state with four ones. In a 7-stage ring oscillator example, only a maximum of 2 bits change as the data is latched by the flops. With a code of 0110000, bit 6 and bit 3 are the bits that undergo a change. Therefore, a code of 0110000 is decoded to 1111000, with bits 6 and 3 changed from zeros to ones. A decoder in accordance with examples herein can decode each code with two ones to a corresponding transition code with four ones. In other examples, other types of decoding may be performed. In other examples, other types of codes may be used. As shown in the example of FIG. 2, if the code captured at time $t_1$ is 0110000, the rising edge at time $t_1$ likely occurred during the transition state N−1, which caused metastability issues due to the length of the transition state (70 picoseconds) compared to the setup/hold time (100 picoseconds). Therefore, the code with two ones is decoded to the closest transition code with four ones.

In alternative systems, the metastability window of the flops could be made smaller by decreasing the setup and/or hold times. However, this alternative solution may increase power consumption, area, or require more expensive components. In another alternative solution described above, an invalid code may be discarded. However, this alternative solution may affect jitter.

The examples herein take advantage of the sequence of three consecutive ones in the oscillator to decode invalid codes to a valid state. The sequence of three consecutive ones occurs in the sequence of bits in a 7-stage ring oscillator with a 3/7 duty cycle, as described below.

Figure 3A:
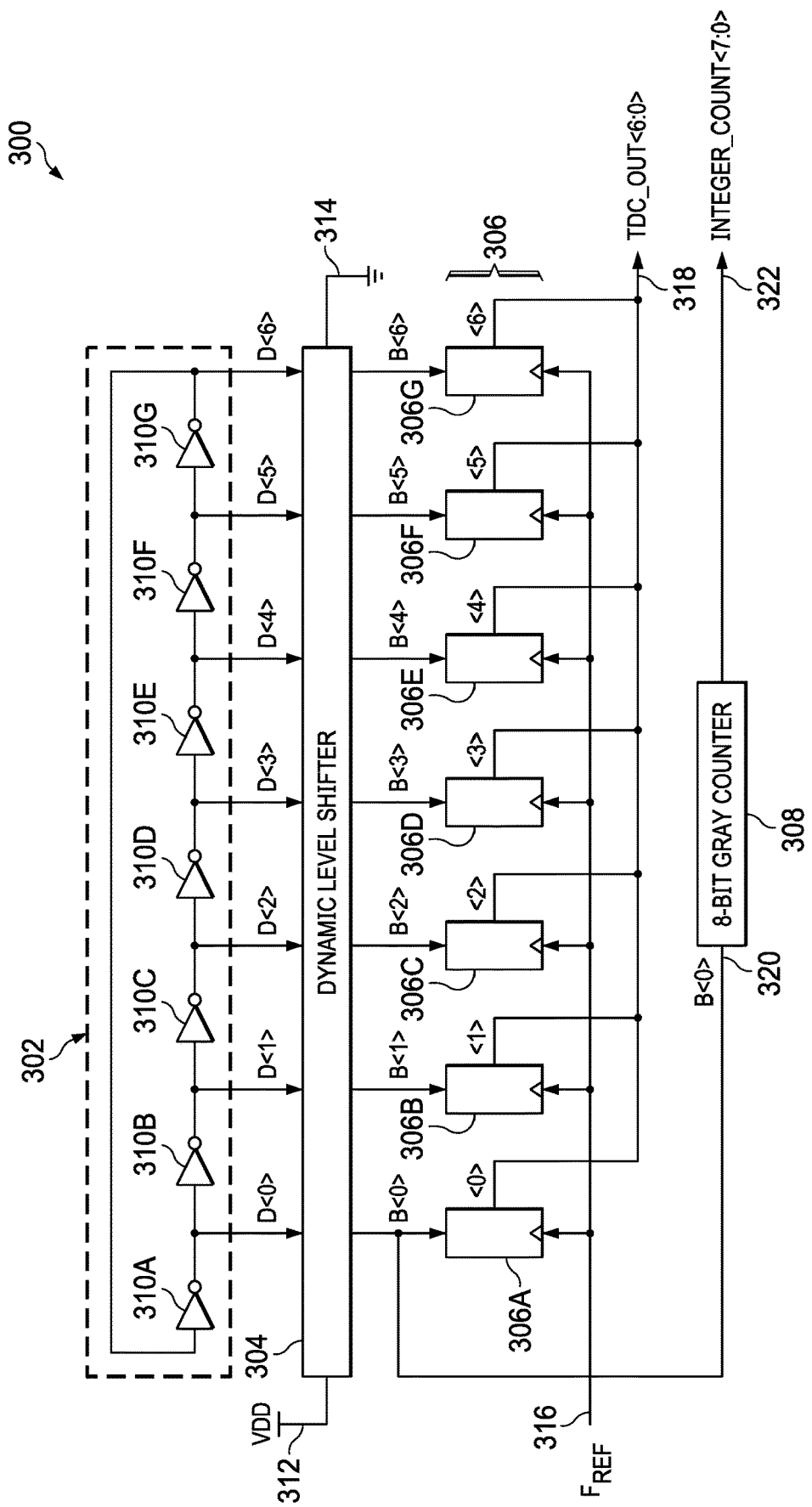
FIG. 3A is a circuit diagram of an embedded TDC in accordance with various examples.

FIG. 3A is a circuit diagram 300 of an embedded TDC in accordance with various examples herein. Circuit diagram 300 includes a ring oscillator 302, a dynamic level shifter 304, flip-flops 306A to 306G (collectively, flops 306), and 8-bit Gray counter 308. Ring oscillator 302 is a 7-stage ring oscillator with seven inverters 310A to 310G (collectively, inverters 310). Dynamic level shifter includes a terminal 312 coupled to a voltage source providing a voltage VDD and a terminal 314 coupled to ground. A reference frequency $F_{REF}$ is provided to flops 306 via terminal 316. Flops 306 provide TDC_OUT <6:0> at output 318. 8-bit Gray counter 308 includes an input 320, which receives B<0>, and an output 322, which produces INTEGER_COUNT <7:0>.

Ring oscillator 302 is oscillator 108 in FIG. 1 in one example. Ring oscillator 302 has a chain of inverters 310 arranged in a ring, and produces an output that oscillates between two values. The output of the last inverter 310G is provided back into the first inverter 310A. Also, adjusting a voltage or current provided to an inverter 310 may change the delay through that inverter 310.

The output signal from each inverter 310 is provided to dynamic level shifter 304. The signals from the inverter 310 outputs that are provided to dynamic level shifter 304 are labeled D<0> to D<6> in this example. The details of dynamic level shifter 304 are described below with respect to FIG. 3B.

Seven output bits are provided by dynamic level shifter 304 to flops 306. These output bits are labeled B<0> to B<6>, and represent the bits of the TDC codes sampled from ring oscillator 302 and stored in flops 306. When an edge (e.g., a rising or falling edge) of the signal reference $F_{REF}$ is provided to flops 306 at a time $t_1$, the flops read the values B<0> to B<6> provided by dynamic level shifter 304 and store those values in the respective flops 306. The values stored in the flops 306 are provided to output 318 to create the code TDC_OUT. The TDC_OUT code has seven binary digits in this example.

The value of B<0> provided to flop 306A is also provided to input 320 of 8-bit Gray counter 308. A Gray counter increments by changing only one bit at a time to change to an adjacent state. 8-bit Gray counter 308 counts the number of full rotations that an edge has undergone. 8-bit Gray counter 308 provides an 8-bit INTEGER_COUNT value at output 322 representing the number of full phase rotations. The INTEGER_COUNT and TDC_OUT values are combined to form the digital phase relationship of the ring oscillator 302 in an integer plus fractional format (via summation 130 shown in FIG. 1), as described above. INTEGER_COUNT provides the integer phase information, and TDC_OUT provides the fractional phase information. This measured phase is compared to an expected phase, and the phase error is calculated.

Figure 3B:
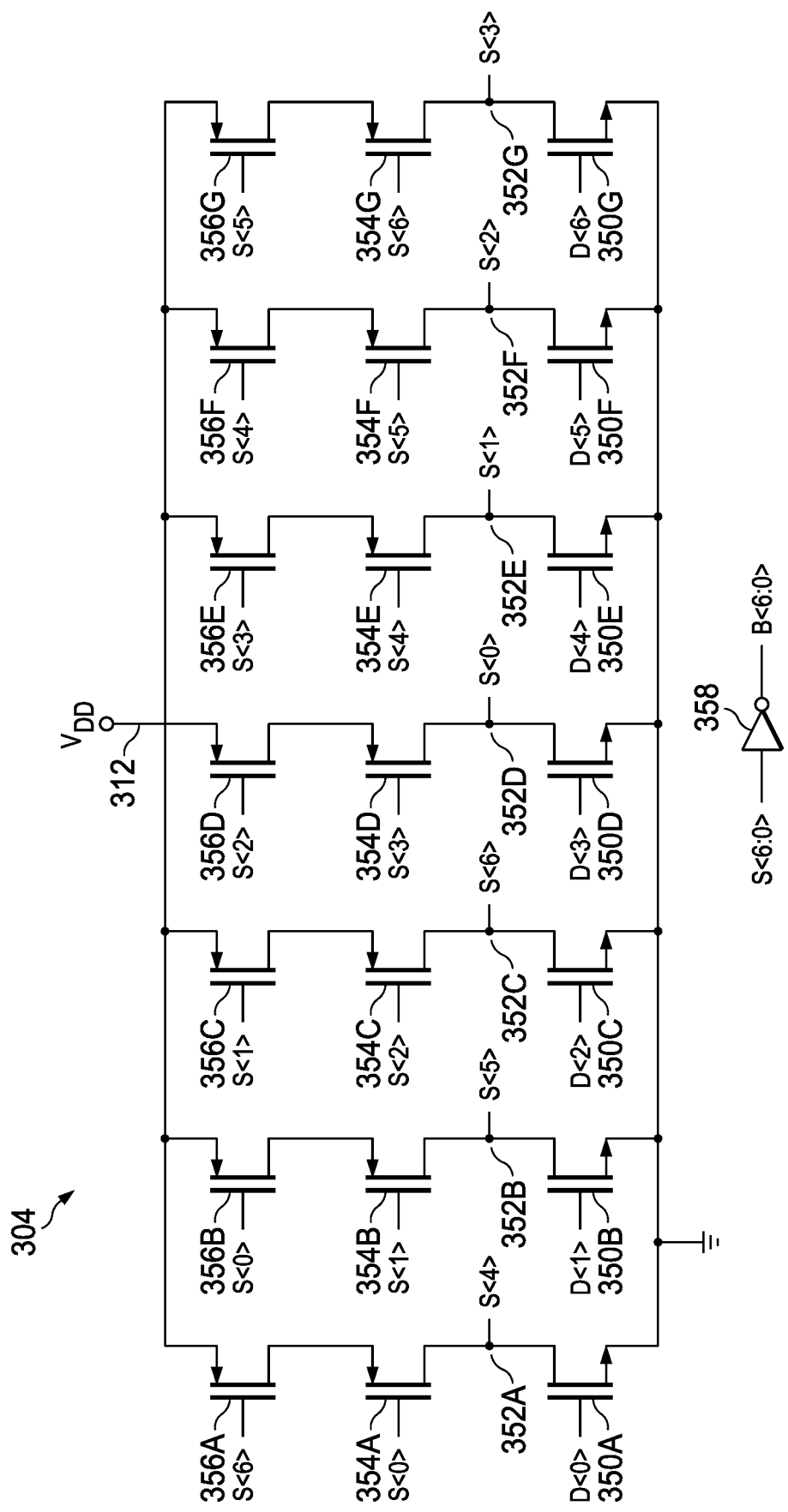
FIG. 3B is a circuit diagram of a dynamic level shifter in accordance with various examples.

FIG. 3B is a circuit diagram of a dynamic level shifter 304 in accordance with various examples herein. Dynamic level shifter 304 receives the values D<6> to D<0> from the inverter 310 outputs. Dynamic level shifter 304 converts those inverter 310 output samples to the output bits B<6> to B<0>, and then provides those output bits to flops 306. Dynamic level shifter 304 receives the values D<0> to D<6> at the gates of transistors 350A to 350G, respectively. The values of D<0> to D<6> are either 0 or 1, based on the inverter 310 outputs. Transistors 350A to 350G turn on and off based on the values of D<0> to D<6>. The voltage values at nodes 352A to 352G (represented by S<0> to S<6>, respectively) also change as D<0> to D<6> change. The nodes 352A to 352G are coupled to the gates of transistors 354A to 354G, and to transistors 356A to 356G, where nodes and gates labeled S<0> are coupled together, nodes and gates labeled S<1> are coupled together, etc. For example, node 352D (S<0>) is coupled to the gate of transistor 354A (S<0>), and also coupled to the gate of transistor 356B (S<0>). As the values D<0> to D<6> change based on the inverter 310 outputs changing, the values of S<0> to S<6> change throughout dynamic level shifter 304 as well.

Dynamic level shifter 304 performs two operations. First, dynamic level shifter 304 shifts from the oscillator 108's local supply voltage to the predominant digital supply voltage used in system 100, and it performs this shift in a power efficient manner. Dynamic level shifter 304 is dynamic, so it only switches and consumes current when the output changes. Second, dynamic level shifter 304 converts a string of ones and zeros (D<0> to D<6>) from inverters 310 to a more readable phase signal. For example, if D<6:0> is sampled at any given time, D<6:0> may be 0101010, then 1101010 (as the first bit changes), then 1001010 (as the second bit changes), etc., because the changes to the inverter 310 outputs work their way through the inverter delays in the loop. These inverter 310 outputs are difficult to sample due to the timing of the changes, so the logic of dynamic level shifter 304 makes each S bit go high (1) during its transition (e.g., from 0 to 1) and stay high (1) for 3 cycles before going low (0). By staying high for three cycles, the bits S<0> to S<6> are easier to capture than reading D<0> to D<6> directly from inverters 310.

Bits S<6:0> are read from dynamic level shifter 304 and inverted by inverter 358. Inverter 358 is not shown as being coupled to the other circuitry in FIG. 3B, but is coupled to the appropriate nodes to receive the seven bits of S<6:0> at an input of inverter 358. In one example, inverter 358 may represent seven inverters, one for each bit. The output of inverter 358 produces seven bits B<6:0>, which are then provided to flops 306A to 306G in FIG. 3A. As described above, these bits B<6:0> (which are the inverse of bits S<6:0>) are held high for three cycles so they can be read more easily from flops 306. The values stored in the flops 306 are provided to output 318 to create the code TDC_OUT as described above with respect to FIG. 3A. Therefore, dynamic level shifter 304 receives the output of inverters 310 (D<0> to D<6>) and creates a more easily read waveform shown as B<0> to B<6> in FIG. 4, which is provided to flops 306.

Figure 4:
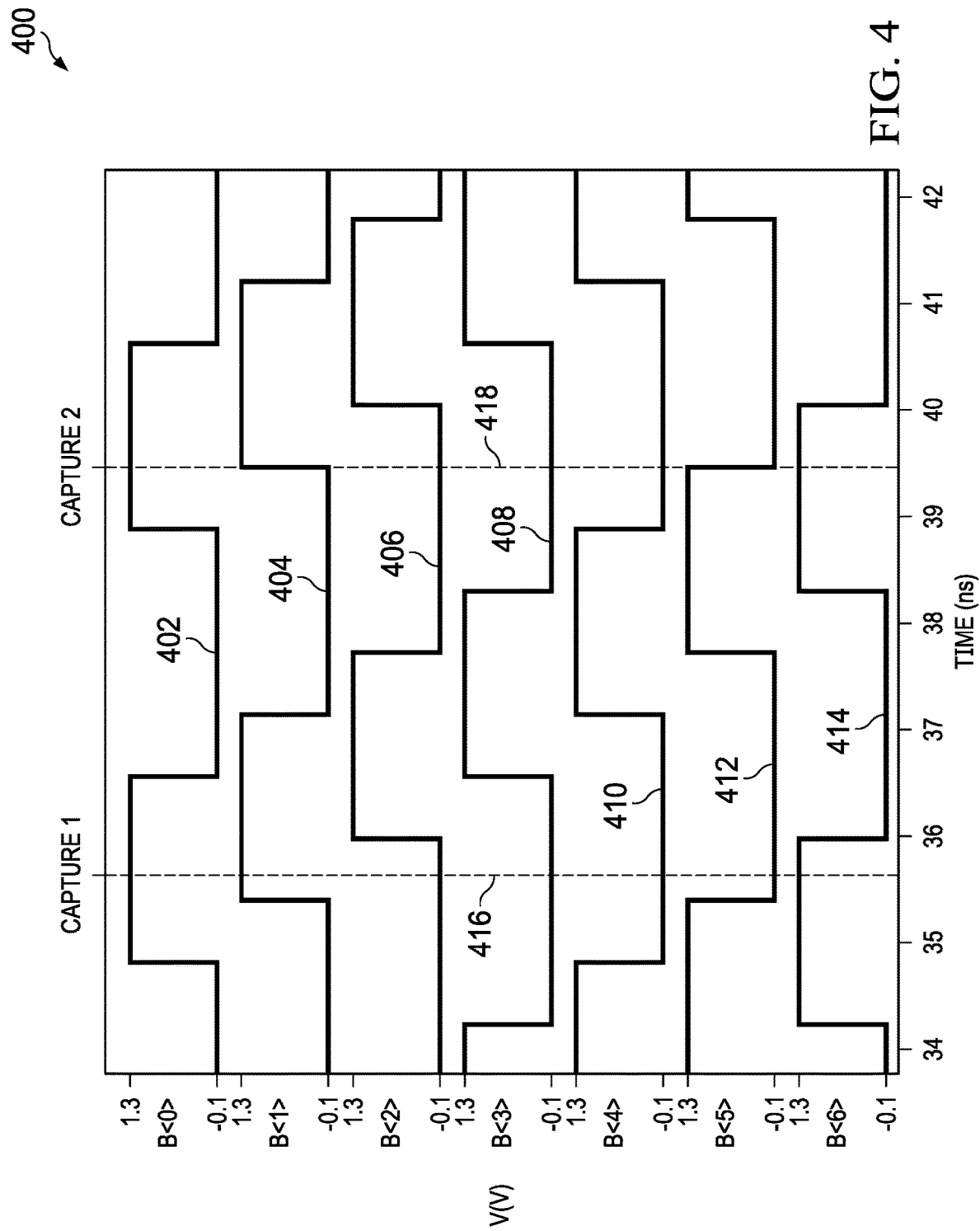
FIG. 4 is a timing diagram of waveforms provided by a level shifter to flops in accordance with various examples.

FIG. 4 is a timing diagram 400 of waveforms B<0> to B<6> provided by dynamic level shifter 304 to flops 306 in accordance with various examples herein. In timing diagram 400, the y-axis represents voltage in volts, while the x-axis represents time in nanoseconds. Waveforms 402, 404, 406, 408, 410, 412, and 414 correspond to voltage values over time for bits B<0> to B<6>, respectively. Timing diagram 400 also includes capture 1 416 and capture 2 418, which are example times that the values of the bits B<0> to B<6> are read, as described below. Waveforms 402, 404, 406, 408, 410, 412, and 414 each have a duty cycle of 3/7, or approximately 43%. A duty cycle of 3/7 results from a valid digital code that has three ones and four zeros (e.g., a cyclic valid state). In other words, the bit is high for 3/7 of the time and low for 4/7 of the time, with the 3 high bits being consecutive.

Waveforms 402, 404, 406, 408, 410, 412, and 414 show that there is a delay from one waveform to the next, starting with waveform 402 and ending with waveform 414. The delay corresponds to the delay of a signal moving through ring oscillator 302 from one inverter 310 to the next. As an example, the first rising edge of waveform 402 (corresponding to B<0>) occurs at approximately 34.7 nanoseconds. The first rising edge of waveform 404 (corresponding to B<1>) occurs at approximately 35.4 nanoseconds. The first rising edge of waveform 406 (corresponding to B<2>)

occurs at approximately 35.9 nanoseconds. The rising edges of the subsequent waveforms 408, 410, 412, and 414 occur at similar intervals.

Timing diagram 400 has two capture times, capture 1 416 and capture 2 418. The capture times indicate a time of a rising edge of reference signal $F_{REF}$ reaching the flops 306. When a rising edge of reference signal $F_{REF}$ is received, the values B<0> to B<6> are read from flops 306. Capture 1 416 occurs at approximately 35.7 nanoseconds. At this time, B<0>, B<1>, and B<6> are high values (1). The other bits (B<2>, B<3>, B<4>, and B<5>) are low (0). Therefore, the code, from B<6> to B<0>, is 1000011 for capture time 1 416. Therefore, TDC_OUT is 1000011, which is a valid code.

Capture 2 418 is another example of a capture time. At approximately 39.4 nanoseconds, capture 2 418 occurs. At this time, bits B<0> and B<6> are high (1). However, this capture time violates the setup/hold time of the flops 306 corresponding to bits B<1> and B<5>. Bits B<1> and B<5> are transitioning at the time of capture 2 418. TDC_OUT could be either 1100011, 1100001, 1000001, or 1000011. If TDC_OUT is either 1100001 or 1000011, those are cyclic valid codes with three ones, and those cyclic valid codes are acceptable valid codes. If TDC_OUT is 1100011, that is a transition state with four ones. Transition states are also valid codes. If TDC_OUT is 1000001, that is an invalid code with only two ones. In examples herein, invalid codes with two ones are decoded to the nearest transition state with four ones. Therefore, 1000001 is decoded to the transition state 1100011.

A state machine may decode the data and convert it to the proper value in one example. Then, the proper value is compared to the $F_{REF}$ to determine the error in the phase. If the phase error is zero, no change is made to the oscillator. If the phase error is high, the oscillator is running too fast, and the PLL will bring the frequency of the oscillator down to accumulate less phase. If the phase is low, the oscillator is running too slow, and the PLL will bring the frequency of the oscillator up to accumulate more phase. The TDC_OUT code, its correction value and the INTEGER_COUNT is the representation of the phase of the oscillator.

FIG. 5 is a table 500 of valid and invalid codes for a 7-stage ring oscillator with an embedded TDC in accordance with various examples. Column A includes the valid B<6:0> codes, which includes the cyclic valid codes with three ones, and the transition states with four ones. Column B indicates whether the codes are transitions states or not, indicated with a Y for yes and an N for no. Column C is a list of possible TDC_OUT <6:0> codes for each valid state. Column D is a decoder fractional value that represents the fractional phase value associated with each possible TDC_OUT <6:0> code.

Rows 1, 3, 5, 7, 9, 11, and 13 show the cyclic valid codes with three ones. Rows 2, 4, 6, 8, 10, 12, and 14 are the valid transition codes with four ones. In these transition code rows, column C indicates the possible codes for each transition state. The TDC_OUT code with two ones that corresponds to each transition state is shown in Column C. If a code with two ones is received, that code is decoded to the transition state in corresponding row in table 500. A lookup table, such as table 500, may be used in some examples by decoder 128 to convert the TDC_OUT code to a fractional phase value as shown in Column D.

FIG. 6 is a flow diagram of a method 600 for metastability correction for a ring oscillator with an embedded TDC in accordance with various examples herein. The steps of method 600 may be performed in any suitable order. The hardware components described above with respect to FIGS. 1, 3A, and 3B may perform method 600 in some examples. In one example, a processor or controller, such as decoder 128, may execute executable code to perform at least some of the steps of method 600.

Method 600 begins at 610, where a set of flops receive a reference signal, such as $F_{REF}$. As described above, flops 306 may receive a reference signal via terminal 316. Each flop receives the reference signal, which may be a rising edge or a falling edge. In an example, N flops of a TDC are coupled to N inverters of a ring oscillator, with one flop coupled to the output of each inverter. In some examples, a level shifter resides between the inverters and the flops. The level shifter receives first data samples from the N inverters and provide second data samples to the N flops.

Method 600 continues at 620, where responsive to receiving the reference signal, each of the flops captures an output of a different stage of a multi-stage ring oscillator. The stages of the ring oscillators may be inverters in some examples, such as inverters 310.

Method 600 continues at 630, where the flops provide a code to a decoder, and the code is based at least in part on the outputs of the stages. In examples described above, the code includes N binary bits, which are outputs of the N inverters 310. The N binary bits constitute a code that encodes phase information of the oscillator signal.

Method 600 continues at 640, where responsive to the code being invalid, decoding the invalid code to a valid code. As described above, some codes are invalid due to metastability issues with the TDC. The invalid codes may include two binary ones (X binary ones) instead of three (X+1) or four (X+2) binary ones in some examples. Other types of valid or invalid codes may be present in other examples.

Method 600 continues at 650, where the valid code is provided to a phase frequency detector, such as PFD 102. The valid code may be provided to PFD 102 by decoder 128. In some examples, the code may be provided to PFD 102 from flops 306. PFD 102 used the code to determine if a phase error exists between the oscillator phase and a phase of the reference frequency. The PFD 102 provides a phase error and the phase locked loop uses the phase error to adjust the phase of the oscillator if the oscillator is out of phase.

In examples herein, a ring oscillator's phase predictability is leveraged to correct phase data corrupted by metastability of a TDC. In addition, low power single-ended ring oscillator topologies may be used. Standard digital library flops with low power and large metastability windows may be included to capture TDC data. Examples herein use the inverters of a ring oscillator as a TDC, saving circuit area and power consumption. Also, invalid codes are decoded instead of discarded, which enables the phase to be corrected or verified at each update cycle. Decoding is performed with a simple decoding scheme. The decode logic may be adjusted as the number of bits changes.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A system, comprising:
   a phase locked loop comprising:
      a set of inverters; and
      a set of flops, wherein each flop of the set of flops is coupled to an output of a different inverter of the set of inverters; and
   a decoder configured to:
      receive a code from the set of flops, wherein the code represents a phase of the phase locked loop;
      responsive to the code being invalid, decode the invalid code to a valid code; and
      provide the valid code to a phase frequency detector.

2. The system of claim 1, wherein the phase locked loop comprises a seven-stage ring oscillator.

3. The system of claim 1, wherein the phase frequency detector is configured to determine a phase error between the phase of the phase locked loop and a phase of a reference signal responsive to receiving the valid code.

4. The system of claim 3, wherein the phase frequency detector is configured to adjust the phase of the phase locked loop responsive to the phase error.

5. The system of claim 1, further comprising:
   a level shifter configured to receive first data samples from the inverters and provide second data samples to the set of flops.

6. The system of claim 1, wherein the decoder is configured to decode the invalid code to a closest valid code.

7. The system of claim 1, wherein the invalid code includes X binary ones, and the valid code includes X+1 or X+2 binary ones.

8. The system of claim 1, wherein the decoder is configured to decode the invalid code with X binary ones to the valid code with X+2 binary ones.

9. The system of claim 1, wherein each flop is configured to sample the output of an inverter responsive to receiving a reference signal.

10. A method, comprising:
    receiving a reference signal at a set of flops;
    responsive to receiving the reference signal, capturing an output of a different stage of a ring oscillator with each of the set of flops;
    providing a code to a decoder, wherein the code is based at least in part on the outputs of the ring oscillator;
    responsive to the code being invalid, decoding the invalid code to a valid code; and
    providing the valid code to a phase frequency detector.

11. The method of claim 10, further comprising:
    determining a phase error between a phase of the ring oscillator and a phase of the reference signal responsive to receiving the valid code.

12. The method of claim 11, further comprising:
    adjusting the phase of the ring oscillator responsive to the phase error.

13. The method of claim 10, wherein decoding the invalid code includes:
    decoding the invalid code to a closest valid code.

14. The method of claim 10, wherein decoding the invalid code includes:
    decoding the invalid code with X binary ones to the valid code with X+2 binary ones.

15. The method of claim 10, wherein the ring oscillator produces an output signal at a multiple of the reference signal.

16. The method of claim 10, wherein the reference signal arrives at the set of flops during a setup time of at least one flop of the set of flops.

17. A system, comprising:
    a ring oscillator including a set of inverters;
    a time to digital converter including a set of flops, wherein each of the flops is coupled to an output of a different inverter;
    a level shifter coupled to the inverters and to the flops;
    a counter coupled to at least one of the flops;
    a decoder coupled to the time to digital converter; and
    a phase frequency detector coupled to the decoder.

18. The system of claim 17, wherein the phase frequency detector is configured to determine a phase error between a phase of the ring oscillator and a phase of a reference signal responsive to receiving a code from the time to digital converter, wherein the code represents the phase of the ring oscillator.

19. The system of claim 18, wherein the decoder is configured to decode an invalid code to a closest valid code.

20. The system of claim 18, wherein the decoder is configured to decode an invalid code with X binary ones to a valid code with X+2 binary ones.

* * * * *